Dec. 24, 1968 HAN YING KU 3,418,180 p-n JUNCTION FORMATION BY THERMAL OXYDATION

Filed June 14, 1965 3 Sheets-Sheet 1

INVENTOR
HAN YING KU

BY

HIS ATTORNEYS

INVENTOR
HAN YING KU
BY Louis A Kline
Armand G. Morin Sr.
HIS ATTORNEYS p-n JUNCTION FORMATION BY THERMAL OXYDATION Filed June 14, 1965 3 Sheets-Sheet 3

INVENTOR
HAN YING KU
BY Louis A. Kline
Armand J. Morin Sr.
HIS ATTORNEYS 3,418,180 p-n JUNCTION FORMATION BY THERMAL OXYDATION

Han Ying Ku, Dayton, Ohio, assignor to The National Cash Register Company, Dayton, Ohio, a corporation of Maryland Filed June 14, 1965, Ser. No. 463,747
3 Claims. (Cl. 148—187)

ABSTRACT OF THE DISCLOSURE

The present invention relates to a method of making an n-type zone under only an unmasked surface area of a selectively masked p-type silicon doubly-doped crystal containing boron and phosphorus or boron and arsenic, by depositing a sufficiently thick silicon oxide layer mask over the surface of said silicon doubly-doped crystal but for a selected area and thermally oxidizing said unmasked surface area at a rate sufficient to cause formation of an n-type zone under only the unmasked area of the p-type silicon doubly-doped crystal.

Figures 1, 2:
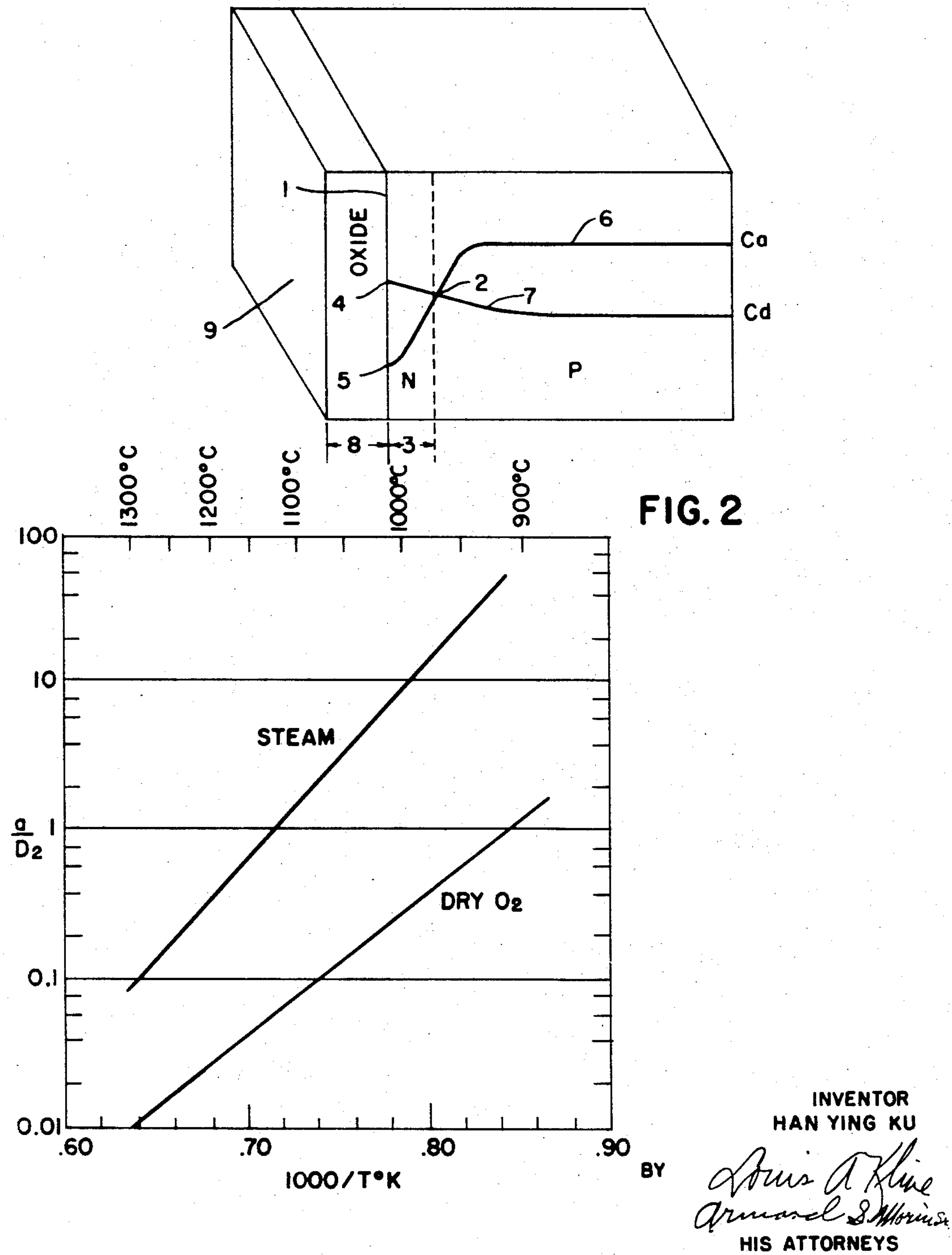

The present invention relates generally to the oxidation of semiconductive materials and more particularly to the formation of p-n junctions in semiconductive materials by the controlled oxidation of such materials containing preselected concentrations of opposite conductivity type determining impurities.

Many methods for producing p-n or rectifying junctions are now known in the art. One such method, for example, provides a junction by heating a semiconductive body in a vapor of a conductivity type determining impurity; another method consists of heating such body in a liquid, such as molten metal, containing dissolved conductivity type determining material. Methods for making grown and alloyed junctions are equally well known in the art.

The present invention provides a method for oxidizing a semiconductive silicon crystal under conditions whereby, with proper selection and control of materials and processing parameters, it is possible to produce both an oxide layer on and a rectifying junction adjacent to one or more surfaces of said crystal; further, the method may be so controlled that, when desired, the silicon oxide layer is formed without concurrent junction formation.

In general, the present invention is particularly valuable in its application for simultaneously producing an oxide layer on and a p-n junction adjacent to an interface separating a silicon and a silicon-oxide zone in a silicon crystal. In this connection, the process finds economic value in its application to the manufacture of field effect transistors, p-n-p transistors, and the like, wherein dimensional characteristics and certain electrical characteristics, such as resistivity, etc., are of critical importance.

It is known in the prior art that silicon is easily oxidized at high temperatures in an oxidizing atmosphere to produce a silicon dioxide layer on the oxidized silicon surface. The formation of oxide is due to the diffusion of an oxygen-bearing species through the oxide layer to the oxide-silicon interface and the subsequent rapid conversion of silicon to silicon dioxide. It is also well known that the thickness X of the oxide layer increases as the square root of the oxidation time, the relation being $X^2=4$ atm. The oxidation rate constant $a$ has a value which depends on the oxidation temperature and the composition of the oxidizing gas and has dimensions the same as those generally utilized in diffusion coefficient measurements. One aspect of the present invention consists of oxidizing a silicon crystal at high temperatures in a selected oxidizing atmosphere to provide a layer of silicon oxide of desired thickness.

Although the oxidation rate constant $a$ varies in a complicated way with the temperature, the pressure, and the composition of the oxidizing atmosphere, it is an easily measurable quantity. Under any specific oxidation condition, it is necessary only to know the oxidation time $t$ and to measure the resulting oxide thickness by an one of the well-known methods, such as the ultraviolet-visible interference method described by E. A. Corl and H. Wimpfheimer, Solid-State Electronics, vol. 7, pp. 755–761, 1964. The oxidation rate constant $a$ is, then, calculated by means of the equation $a=X^2/4t$.

When the semiconductive crystal being oxidized is selected to contain predetermined concentrations of conductivity type determining acceptor and donor impurities, oxidation of the crystal at selected temperatures in certain oxidizing atmospheres, to be described hereinafter, provides a p-n junction of known depth and of known impurity concentration at the semiconductor-oxide interface.

Thus, the method of the invention provides a p-type silicon crystal with an n-type layer having electrical characteristics which may be controlled within desirable and rather wide limits.

It is known that oxidation of a silicon semiconductor containing selected concentrations of acceptor and donor impurities causes the impurities to be redistributed between the newly-formed silicon oxide and the unoxidized silicon. As the oxdization of the crystal progresses, the thickness of the oxide layer increases, and the interface formed between the growing oxide and the semiconductor crystal moves, in effect, into the crystal body. The solutes, acceptor and donor impurities, are present in the bulk crystal in two selected concentrations; during oxidation, they are redistributed between the oxide on one side of the interface and the semiconductive crystal on the other side of the interface. The course of the redistribution is affected by the loss of impurities to the ambient gas making up the oxidizing system.

Grove et al., Journal of Applied Physics, vol. 35, No. 9, September 1964, and Deal et al., Journal of Electrochemical Society, vol. 112, No. 3, March 1965, have shown that this mechanism is important, and they have suggested that both gallium and indium impurities are evaporated from the solid system to the ambient gas in the oxidation of silicon containing such impurities. Grove et al. and Deal et al. have also experimentally shown that Group III acceptors Al, B, Ga, and In are depleted and Group V donors P, As, and Sb are accumulated in the silicon during thermal oxidation thereof. Previously, it had been thought and disclosed by others (for example, U.S. Patent No. 2,953,486, issued to Martin M. Atalla on Sept. 20, 1960) that all of the above-mentioned impurities accumulated at the oxide-silicon interface and that this accumulation resulted in a p-n junction. Contrary to the disclosure in the above-mentioned patent, as will be evident hereinafter, the formation according to the present invention of a p-n junction by thermal oxidation of a suitable silicon crystal depends on depletion of acceptor impurities and accumulation of donor impurities at the oxide-silicon interface.

In the light of the more recent developments, a better understanding of the theory, as well as the more practical aspects, of junction formation has led directly to the methods of the present invention, wherein sufficiently precise control of process variables and materials enables one to provide a semiconductive crystal having at least one p-n junction, each junction having a preselected acceptor-donor pair concentration, preselected junction depth, and preselected resistivity.

Broadly, an object of the present invention is the definition of a process for making P-N junctions in semiconductive crystal materials by the thermal oxidation of said crystal.

A principal object of the invention is the provision of a process for making a p-n junction of preselected surface concentration and of preselected depth by thermal oxidation of a double doped p-type semiconductive silicon crystal.

Yet another object of the invention is the provision of the process adapted to produce p-n junctions in selected areas only of a double doped p-type semiconductive silicon crystal when such crystal is oxidized according to the process of the present invention.

Another object of the invention is the provision of a process adapted for making, in an efficient and desirable manner, separately or simultaneously, the n-channel of a field effect transistor and/or the base layer of a p-n-p transistor.

For the purposes of this invention, the redistribution factors $R_a$ and $R_d$, acceptor and donor impurity redistribution factors, respectively, may each be defined as the ratio of the surface concentration of the redistributed impurity to the original bulk concentration of the respective impurities.

Although the extent of the redistribution has been found to be dependent on many factors, the concentration profile of the redistributed acceptor and donor solutes has been studied, and exact mathematical solutions have been obtained for the concentration distribution within the crystal by Han Ying Ku (Journal of Applied Physics, vol. 35, pp. 3391–3397, November 1964). The redistribution factors $R_a$ and $R_d$ depend principally on (1) the volume ratio $m$ of the silicon to the resulting oxide, (2) the segregation coefficient $k$ of the solute defined as the ratio of the equilibrium concentration of the solute in the oxide to that in the silicon at the silicon-oxide interface, and (3) the diffusion coefficients $D_1$ and $D_2$ of the acceptor and donor solutes in the oxide and in the silicon, respectively.

A significant fact concerning the redistribution factors $R_a$ and $R_d$ is that the surface concentrations of the redistributed solutes at the silicon-oxide interface are independent of the oxidation time $t$, so that the redistribution factors are constant under a given oxidation condition.

Another significant fact, which will be developed further below, is that, for each acceptor and donor solute, the ratio of the surface concentration to its bulk concentration is a function of the ratio $a/D_1$ and $a/D_2$. It will also be clear from the following that, because of this, the surface concentrations of the redistributed solutes can be controlled by judicious selection of the oxidation temperature and the composition of the oxidizing gas.

As stated above, in silicon, the acceptors, boron, aluminum, gallium, and indium are all depleted at the oxide-silicon interface, so that their redistribution factors are less than "one"; and the donors phosphorus, arsenic, and antimony are all accumulated at the oxide-silicon interface, so that their redistribution factors $R_d$ are greater than "one." However, in order to provide a P-N junction by the thermal oxidation of a double doped p-type silicon crystal, it is necessary, according to the method of the invention, that the acceptor concentration be higher than the donor concentration in the said silicon crystal. That is, one requirement in the provision of a p-n junction according to the invention is that the ratio of the concentration of the acceptor to the concentration of the donor be greated than "one." By definition, then, a semiconductor containing an acceptor concentration $C_{a0}$ and a donor concentration $C_{d0}$ will, when oxidized, have a surface concentration at the silicon interface of the acceptor equal to $R_aC_{a0}$ and of the donor equal to $R_dC_{c0}$.

A further and critical limitation on the process of the present invention is that a p-n junction is formed if the aceptor concentration $C_{a0}$ is larger than the donor concentration $C_{d0}$ and if the conditions in the following inequality are true:

$$1<C_{a0}/C_{d0}<R_d/R_a$$

In this case of silicon, the redistribution factor $R_d$ of any donor is greater than "one"; the factor $R_a$ of any acceptor is less than "one"; and the ratio of the redistribution factors $R_d/R_a$ is always greater than "one." Therefore, the acceptor concentration $C_{a0}$ must be larger than the donor concentration $C_{d0}$. However, these are only requirements of a specific embodiment of this invention and are not restrictions on this invention.

In general, as will be made clear later, the redistribution factors of different impurities in a semiconductive material are not equal. Therefore, a requirement of this invention is to select a pair of donor-acceptor impurities of unequal redistribtuion factors. Another requirement is that the semiconductive material must contain these two impurities at different concentrations. The semiconductive material will be n-type or p-type according to the type of the impurity of higher concentration. In order to form a P-N junction by thermal oxidation, the impurity having the higher concentration must have smaller redistribution factor.

Therefore, a feature of this invention is the preparation of a semiconductive material containing two opposite conductivity type determining impurities of unequal redistribution factors at preselected concentrations such that the higher concentration impurity has a smaller redistribution factor.

If the redistribution factor $R_a$ of the acceptor is larger than the redistribution factor $R_d$ of the donor, then the donor concentration $C_{d0}$ must be larger than the acceptor concentration $C_{a0}$. In other words, if $R_a/R_d>1$, then we must have $C_{d0}/C_{a0}<1$, the double doped semiconductive material is n-type. A p-type layer will be formed under the oxide layer during thermal oxidation if the following conditions are true:

$$1<C_{d0}/C_{a0}<R_a/R_d$$

The double doped semiconductive material can be prepared by many well-known methods. It can be grown in the form of a rod in a horizontal boat or be pulled out vertically from its melt in a crucible; or it may be deposited from a vapor phase onto a substrate which may be amorphous or crystalline, polycrystalline or single crystal, of the same or different composition and structure as the semiconductive material deposited on.

In particular, a double doped silicon crystal may be prepared by the Czochralski method or the floating zone method, and a thin layer of double doped material can be deposited from a vapor phase epitaxially on a single crystal silicon substrate of either n-type or p-type, or on an amorphous substrate such as fused silica, sapphire, or alumina. The growing of silicon single crystals and epitaxial deposition of silicon films are well known to all those familiar with the art of crystal growth.

As mentioned above, the factor R is a function of several variables, and the relationship of several of these variables with respect to the factor R will be set forth in some detail below.

The objects of the invention will become apparent from the following description and claims, in conjunction with the accompanying drawings, which disclose, by way of example, certain preferred embodiments of the invention when it is applied to silicon.

In the drawings:

FIG. 1 is a perspective diagrammatic view, intended to represent the relationship of the oxide formed on a silicon body, and the acceptor and donor impurities redistributed within a double doped silicon body oxidized according to the method of the present invention.

FIG. 2 graphically depicts the ratio of the oxidation rate constant and diffusion coefficient of boron $a/D_2$ as a function of the temperature.

Figure 3:
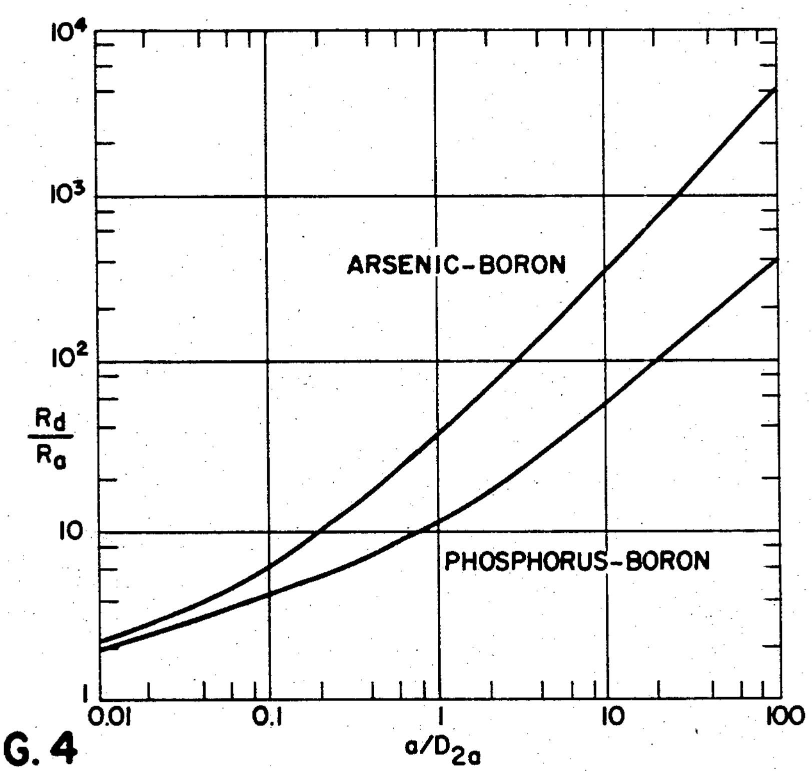

FIG. 3 depicts the change in $R_d/R_a$ for an arsenic-boron pair and a phosphorus-boron pair as a function of $a/D_{2a}$.

Figure 4:
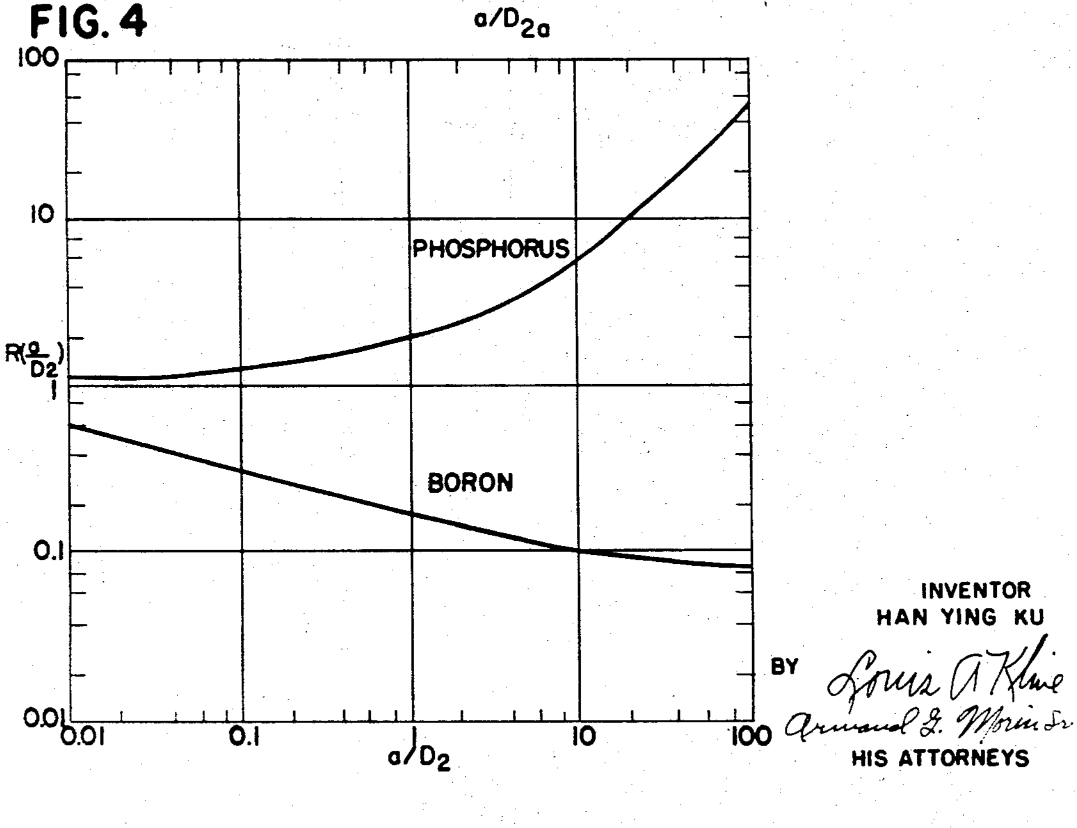
Figures 5, 6, 7:
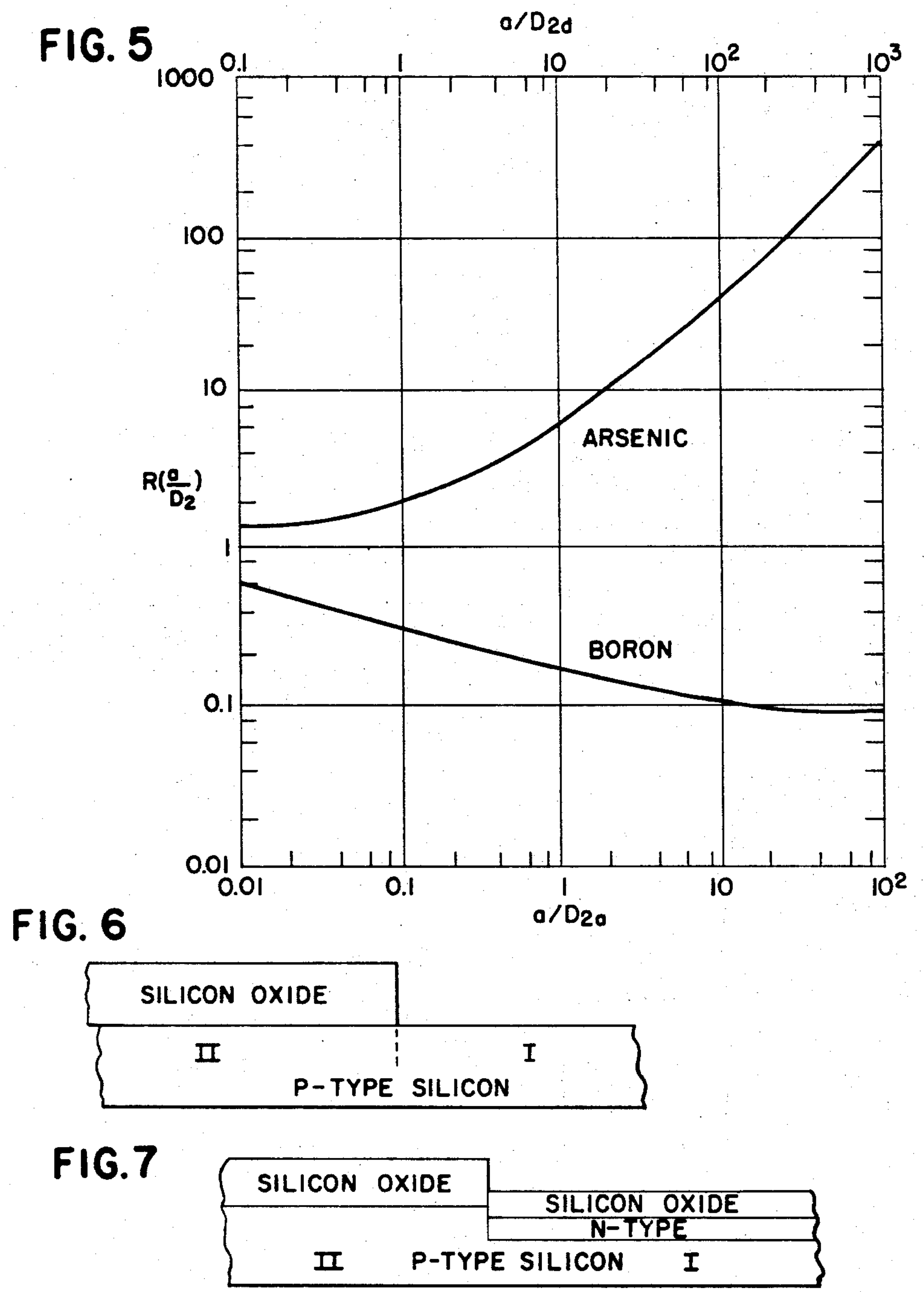

FIGS. 4 and 5 relate values of R as a function of $a/D_{2a}$.

FIGS. 6 and 7, respectively, depict cross-sectional views of a silicon body before and after oxidation according to the novel method of the invention.

In FIG. 1, the bulk equilibrium concentration of acceptor and donor impurities in the silicon body is shown by the curves 6 and 7, respectively. Thus, the abscissa represents the distance into silicon crystal, and the ordinate represents the concentration of the said impurities in the silicon body.

Oxidation of the silicon body forms an oxide layer 9 having a depth 8 on one side of the interface 1, which interface separates the silicon body and the oxide layer. The intersection of the curves 6 and 7 at the point 2 represents the P-N junction. The distance 3 into the crystal measured from the interface 1 is variable and depends on the impurity pair and on the oxidation conditions. The redistribution concentration of the acceptor and donor impurity on the silicon side of the interface 1 is shown in FIG. 1 as the point 5 and as the point 4, respectively. FIG. 2 relates the temperature dependence of the ratio of the oxidation rate constant to the diffusion rate, $a/D_2$, of a boron-doped silicon for oxidation in steam and in dry oxygen. It is apparent from the curves that the ratio $a/D_2$ is a decreasing function of temperature; as the temperature increases, the ratio decreases.

FIG. 3 relates the ratio $R_d/R_a$ as a function of $a/D_{2a}$. The upper curve refers to a silicon crystal doped with an arsenic-boron pair, and the lower curve refers to a phosphorus-boron pair.

FIG. 4 depicts the variation of the redistribution factors $R_d$ and $R_a$ for phosphorus and for boron as a function of $a/D_2$.

FIG. 5 shows a curves representing the redistribution factors $R_d$ and $R_a$ plotted as functions of $a/D_{2a}$ for a silicon body containing boron and arsenic impurities. In this figure, $R_a$ is the same as that in FIG. 4; however, the curve $R_d$ has been displaced to the left by a factor of "ten" in the log-log plot, since the diffusion coefficient of arsenic is about one tenth that of boron. Hence, under any given condition, $a/D_{2d}$ of arsenic is about ten times $a/D_{2a}$ of boron.

In FIG. 6 there is shown a cross-sectional view of a p-type silicon body having two areas or zones, zone II being covered with a thin layer of silicon oxide, and zone I having no oxide or other layer of any sort on its surface.

FIG. 7 shows a cross-sectional view of the p-type silicon body of FIG. 6 after thermal oxidation by the process of the present invention. In this figure, zone II is covered with a silicon oxide layer, and zone I is now overlaid with two layers, the top layer consisting of a silicon oxide layer, which grows on the silicon during thermal oxidation, and a second layer, consisting of an n-type semiconductive zone located directly below the silicon oxide layer.

The necessary conditions for making an n-type layer over p-type silicon by thermal oxidation are implicit in the following statements and formulas. The curves in the various figures have been produced from data derived from the various formulas.

If $C_0$ is the concentration in silicon of a certain solute with segregation coefficient $k$, diffusion coefficient $D_1$ in the oxide, and diffusion coefficient $D_2$ in the silicon, and if $C_2(X)$ is the surface concentration of the redistributed solute at the silicon-oxide interface, then, since $C_2(X)$ is time-dependent, the redistribution factor R may be defined by the equation $$R=C_2(X)/C_0 \qquad (1)$$

As heretofore disclosed, the Group III acceptors (aluminum, boron, gallium, and indium) are all depleted at the silicon-silicon oxide interface, and the three Group V donors (phosphorus, arsenic, and antimony) are all accumulated at the said interface, so that $R_a$ for the acceptors is less than "one" and $R_d$ for the three donors is greater than "one." The redistribution factor R, as is known, is a function of $m$, $k$, $a/D_2$, $D_1/D_2$, and the boundary condition at the oxide-gas interface.

Thus, the factor R is dependent on whether or not the solute impurity is soluble or insoluble in the silicon oxide body. If the oxide-gas interface is impervious to the solute impurity, then $$R=\frac{\pi^{-1/2}\exp(-m^2a/D_2)}{\pi^{-1/2}\exp(-m^2a/D_2)-(m-k)(a/D_2)^{1/2}\operatorname{erfc}(m^2a/D_2)^{1/2}} \qquad (2)$$

If the solute impurity is lost to the ambient gas atmosphere through the silicon-oxide-gas interface, so that the concentration of said solute at the oxide-gas interface is $C_s$, then $$R=\frac{v_1u_2+(C_s/C_0)r^{1/2}u_1v_2}{kr^{1/2}u_1v_2+v_1[u_2-(m-k)(a/D_2)^{1/2}v_2]} \qquad (3)$$

where $$\begin{aligned} u_1&=\pi^{-1/2}\exp(-a/rD_2),\\ v_1&=\operatorname{erf}(a/rD_2)^{1/2},\\ u_2&=\pi^{-1/2}\exp(-m^2a/D_2),\\ v_2&=\operatorname{erfc}(M^2a/D_2)^{1/2},\\ r&=D_1/D_2. \end{aligned} \qquad (4)$$

If the diffusion coefficient $D_1$ of the solute is negligible compared to the diffusion coefficient $D_2$ in the silicon body, then Equation 3 reduces to Equation 2.

As previously stated, depletion of gallium and indium at the oxide-silicon interface during thermal oxidation of silicon is, at least in a large measure, due to the evaporation of these elements from the solid system to the ambient gas. Hence, the redistribution factor R for these acceptor elements is given by the Equation 3. It is also known, as has been indicated above, that boron and the Group V donors have very small diffusion coefficients in the silicon oxide, and that they do not evaporate into the ambient gas atmosphere from the silicon oxide-silicon system. Hence, factor R of the donor elements phosphorus, arsenic, and antimony is given by Formula 2. If, as evidence now indicates, the donor and acceptor impurities do not interact with each other, then they redistribute independently during oxidation. Thus, in a double doped p-type silicon body containing a donor impurity concentration of $C_{d0}$ and an acceptor impurity concentration of $C_{a0}(1<C_{a0}/C_{d0})$, having segregation coefficients $k_d$ and $k_a$, and diffusion coefficients in silicon $D_{2d}$ and $D_{2a}$, respectively, the silicon body has surface concentrations of the redistributed solutes of $C_{d0}R_d$ and $C_{a0}R_a$ and a donor concentration at the surface of $$N_d=C_{a0}R_d-C_{a0}R_a \qquad (5)$$

In view of the above, an n-type layer of constant surface concentration is formed over the p-type silicon during thermal oxidation if $N_d<0$; that is, if $$R_d/R_a<C_{a0}/C_{d0} \qquad (6)$$

This relation (6) and the requirement that the acceptor concentration $C_{a0}$ be larger than the donor concentration $C_{d0}$ may be combined together into the following conditions for junction formation:

$$1<C_{a0}/C_{d0}<R_d/R_a \qquad (7)$$

There are two inequalities in (7); the one on the left indicates that the material must be p-type, and the one on the right indicates the condition for forming an n-type layer on the p-type silicon. It is significant that the higher concentration impurity, the acceptor, has a smaller redistribution factor.

Ratio $R_d/R_a$ is an increasing function of $a/D_2$, and inequality (7) gives the minimum value of $a/D_{2a}$ for which a junction is formed during thermal oxidation in accordance with the instant method.

Within the silicon body, the net donor concentration is $$N_d(x,t)=C_{d0}+C_{d0}(R_d-1)\frac{\text{erfc}\,[x/(4D_{2d}t)^{1/2}+m(a/D_{2d})^{1/2}]}{\text{erfc}\,(m^2a/D_{2a})^{1/2}}-C_{a0}-C_{a0}(R_a-1)\frac{\text{erfc}\,[x/(4D_{2a}t)^{1/2}+m(a/D_{2a})^{1/2}]}{\text{erfc}\,(m^2a/D_{2a})^{1/2}} \quad (8)$$

The location of the p-n junction (the distance within the slican body away from the oxide-silicon interface) can be found by use of Equation 8. By setting $N_d(x, t)$ to zero and solving the resulting equation for $x$, the junction position within the silicon body can be determined. The following equality is derived from Equation 8 if $D_{2a}=D_{2d}=D_2$, $$\frac{\text{erfc}\,[x_j/(4D_2t)^{1/2}+m(a/D_2)^{1/2}]}{\text{erfc}\,(m^2a/D_2)^{1/2}}=\frac{C_{a0}-C_{d0}}{C_{d0}(R_d-1)-C_{a0}(R_a-1)} \quad (9)$$

wherein, in this equation, $x_j$ is the junction location. The left-hand member of Equation 9 may be plotted as a function of $x_j/4D_2t)^{1/2}$ with $a/D_2$ as a parameter. In a given situation, if the ratio $C_{a0}/C_{d0}$ and the redistribution factors $R_d$ and $R_a$ are known, then $X_j/(4D_2t)^{1/2}$ is easily measured off from the appropriate curve among the family of curves obtained by plotting Equation 9. From Equation 9 it is readily apparent that the junction depth increases as the square root of the oxidation time.

By way of example, use of the foregoing equations and of the curves shown in the accompanying figures will be described below by reference to specific examples of acceptor-donor impurities. An oxide passivated n-type layer on a surface of a p-type silicon body is prepared, for example, by the thermal oxidation of a double doped silicon material.

PHOSPHORUS-BORON IMPURITY PAIR

In this embodiment, a double doped silicon crystal material containing $10^{16}$ atoms per cubic centimeter of boron as the acceptor impurity and $8\times10^{15}$ atoms per cubic centimeter of phosphorus as the donor impurity was thermally oxidized in steam at 1200 degrees centigrade. After two hours of oxidation, there was formed an n-type channel having a surface donor concentration of about $10^{16}$ atoms per cubic centimeter and a depth of slightly over one micron. In this embodiment, the surface concentration of phosphorus went up to about $1.2\times10^{16}$ atoms per cubic centimeter ($R_d=1.5$), and that of boron went down to about $2\times10^{15}$ atoms per cubic centimeter ($R_a=0.2$).

In the present embodiment, the acceptor-donor concentration ratio $C_{a0}/C_{d0}$ is 1.25 in the bulk silicon crystal, and the ratio $R_d/R_a$ is 7.5.

It should be noted that the ratio $C_{a0}/C_{d0}$ may be varied over a considerable range and the method still provide a passivated n-type layer in a silicon system, provided that the ratio $C_{a0}/C_{d0}$ is kept over "one." The closer the ratio $C_{a0}/C_{d0}$ approaches "one," the deeper the p-n junction tends to be if the other variables are kept constant, and if, of course, the ratio $R_d/R_a$ is greater than the ratio $C_{a0}/C_{d0}$, a basic requirement in the method of this invention when applied to silicon.

A better understanding of the methods of the present invention, and of its application, will follow from a closer analysis of the various parameters as they are presented in the figures appended hereto.

It is known, for example, that the diffusion coefficients of boron and phosphorus in silicon have almost the same value, so that, under any given oxidation condition $a/D_{2a}=a/D_{2d}=a/D_2$. The segregation coefficients $k$ of phosphorus and of boron are not definitely known; however, the segregation coefficient of phosphorus is known to be less than $10^{-3}$, as estimated by Thurmond in "Properties of Elemental and Compound Semiconductors and Element Compound Semiconductors," edited by H. C. Gatos (Interscience Publishers, Incorporated, 1960), p. 121.

Since the redistribution factors for small values of $k$ are essentially equal to that for $k=0$ under oxidation conditions for which $a/D_2<1$, it is reasonable to take $k=0$ as the segregation coefficient of phosphorus. The upper curve in FIG. 4 is obtained by substituting $k=0$ in Equation 2.

The segregation coefficient $k$ of boron is obtained by fitting experimentally-obtained data, such as the experimentally-obtained junction depth of an n-type layer produced in a p-type silicon double-doped with boron and phosphorus, to Equations 2 and 9. In this manner, the segregation coefficient of boron in the temperature range of 1000 degrees centigrade to 1200 degrees centigrade is found to be about 5. The lower curve in FIG. 4 represents the redistribution factor $R_a$ of boron as a function of $a/D_2$ obtained by substituting $k=5$ in Equation 2.

Although it is known that $m$, the volume ratio of silicon to silicon oxide, varies from 0.44 for oxidation in oxygen to about 0.41 for oxidation in steam and high temperatures, for reasons of simplicity, the curves in FIGS. 1 to 6, inclusive, disclosed in this application were plotted with $m$ equal to 0.44.

FIG. 3 shows the relationship between the ratio $R_d/R_a$ and the ratio $a/D_{2a}$. The upper and lower curves in FIG. 3, as previously explained, relate to a silicon body containing an arsenic-boron pair and a silicon body containing a phosphorus-boron pair, respectively. With reference to both of these curves, it is seen that $R_d/R_a$ is a monotonically increasing function of $a/D_{2a}$, a relationship which tends to indicate that the p-n junction can be formed more readily at a large ratio of $a/D_{2a}$. However, as shown in FIG. 2, $a/D_2$ is a decreasing function of temperature, so that a larger $a/D_2$ is obtained by oxidation of a silicon body in steam at a lower temperature. Thus, to obtain a given junction depth, a longer oxidation time is required if oxidation takes place under conditions of a large $a/D_2$ ratio. It has been found that the optimum conditions required to obtain a junction depth of about one micron is oxidation in steam at between the temperatures of 1100 degrees centigrade to about 1250 degrees centigrade, which values correspond to a range of $a/D_2$ from 0.1 to 1. The p-n junction formed under these conditions is essentially due to the depletion of boron.

The following example illustrates the use of the above-mentioned curves in predicting whether or not an n-type layer will be formed on the oxidized silicon body.

In this example, the silicon body contains acceptor-donor impurities such that the ratio $C_{a0}/C_{d0}$ equals 40, the concentration of the acceptor boron being $4\times10^{17}$ atoms per cubic centimeter, and of donor phosphorus concentration equal to $10^{16}$ atoms per cubic centimeter. Now, referring to FIG. 3, it can be seen that $R_d/R_a$ is greater than 40 only if the ratio $a/D_2$ is greater than "four." Now, referring to FIG. 2, it can be seen that $a/D_2$ is greater than "four" at reduced temperatures, such as below 1000 degrees centigrade for oxidation in steam. In order to produce an n-type layer over the p-type silicon under these circumstances, it is necessary to oxidize the sample for many hours because of the reduced rate of oxidation at temperatures below 1000 degrees centigrade. Again, from FIG. 2, it is obvious that no n-type skin or layer can be formed if the silicon sample is oxidized in dry oxygen at any temperature for any reasonable time.

ARSENIC-BORON PAIR

This example consists of a silicon crystal material containing as impurities therein boron as an acceptor material in a concentration of $5\times10^{17}$ and arsenic as a donor impurity in a concentration of $1\times10^{17}$. This double doped body, as described, was oxidized in steam at 1150 degrees centigrade. After two hours, there was formed an n-type channel having a surface donor concenration of arsenic of about $8\times10^{17}$ and an acceptor impurity concentration with boron of about $1\times10^{17}$, the channel having a depth of about one-half micron. The parameters to be considered in making an n-type channel on a silicon crystal material containing arsenic-boron impurities are shown in FIGS. 2, 3, and 5.

In a manner similar to the considerations presented in the analysis of the phosphorus-boron impurity pair, the arsenic-boron pair curves shown in the figures mentioned above are derived from Equations 2 and 9, wherein, as with phosphorus, $k_d=0$ for arsenic and $k_a=5$ for boron. The diffusion coefficient of arsenic is about one tenth that of boron; hence, under any given oxidation condition $a/D_2$ is about ten times the ratio $a/D_2$. Thus, as shown in FIG. 5, the redistribution factors $R_d$ and $R_a$ are plotted as functions of the ratio $a/D_{2a}$. The factor $R_a$ for boron is the same as that in FIG. 4; however, the value of $R_d$ has been displaced toward the left by a factor of "10" in the plot of FIG. 5, inasmuch as the diffusion coefficient of arsenic is one tenth as great as that of boron.

Referring now to FIG. 3, the upper curve shows the ratio $R_d/R_a$ of the arsenic-boron pair as a function of $a/D_2$. The ordinate of this curve is the distance between the two points of the same abscissa on the two curves of $R_d$ and $R_a$ in FIG. 5. In FIG. 3, the upper curve shows that $R_d/R_a$ for the arsenic-boron pair is larger and has a steeper slope than that of the phosphorus-boron pair. Hence, it is to be expected that a p-n junction can be formed more readily in silicon double doped with an arsenic-boron pair than in silicon doped with a phosphorus-boron pair. The increase in the ratio $R_d/R_a$ is due simply to an increase in $R_d$, so that the n-type layer formed has a higher surface concentration of the donor. However, because of the smaller diffusion coefficient of the donor arsenic atoms, the depth of the channel is not increased. It follows, therefore, that a silicon body double doped with an arsenic-boron pair will, upon thermal oxidation, yield an n-type layer of greater donor surface concentration and greater concentration gradient than one double doped with a phosphorus-boron pair but having about equal channel depths. In this example, the concentration ratio $C_a/C_d=5$, and, when $a/D_{2a}=1$, which is equivalent to thermal oxidizing conditions in steam at 1,150 degrees centigrade, the ratio of redistribution factors $R_d/R_a=40$.

The invention is also effective for making n-type layers on silicon semiconductive materials containing other impurity pairs than those specifically defined above. For example, the thermal oxidation of a silicon material containing $10^{18}$ atoms per cubic centimeter of indium and $5\times10^{17}$ atoms of phosphorus per cubic centimeter provides an n-type layer over the p-type silicon semiconductor. In this instance, the n-type layer is produced by the thermal oxidation of the silicon material in pure oxygen at 1,000 degrees centigrade for four hours. The oxidation causes the surface concentration of the indium to go down to $1\times10^{17}$ atoms per cubic centimeter and the concentration of the phosphorus to go up to $8\times10^{17}$ atoms per cubic centimeter.

It is significant to note that the higher concentration impurity indium has a smaller diffusion coefficient, contrary to disclosures heretofore made; note, for example, the above-mentioned U.S. Patent No. 2,953,486, granted to Martin M. Atalla on Sept. 20, 1960.

Yet another silicon semiconductor material containing an impurity pair with which a p-n junction can be formed is one containing impurity pair gallium-antimony.

The segregation coefficient of gallium and of antimony is about 0. The diffusion coefficient of gallium, however, is larger than that of antimony. An n-type layer is provided on a silicon semiconductive body containing $10^{17}$ atoms per cubic centimeter of gallium and $2\times10^{16}$ atoms per cubic centimeter of antimony by oxidizing the said body in steam at about 920 degrees centigrade. In this example, the surface concentration of antimony goes up to about $3\times10^{16}$ atoms per cubic centimeter, and the concentration of gallium goes down to less than $2\times10^{16}$ atoms per cubic centimeter.

In view of the foregoing, it will be apparent to those skilled in the art that an n-type layer may be provided on a p-type silicon material by the thermal oxidation of such material under different temperature and other conditions. For all donor-acceptor pairs, the redistribution factors are functions of the ratio $a/D_{2a}$. Identical examples oxidized at different temperatures and in different oxidizing gases but in which the ratio $a/D_{2a}$ is the same have the same redistribution factors and the same surface concentrations of the redistributed solutes and, thus, the same surface concentration of the donors in the n-type layers formed during the thermal oxidation.

FIG. 2 depicts that the ratio $a/D_2$ decreases as the temperature increases. This is true both for oxidation in steam and for oxidation in dry oxygen. FIG. 2 also shows that the curve for oxidation in steam lies above that for oxidation in dry oxygen. At any temperature, the ratio $a/D_{2a}$ is larger in steam than in dry oxygen. It is also true that any intermediate value between these two curves can be obtained by a suitable mixture of steam and oxygen. A value of $a/D_{2a}$ smaller than that obtainable in dry oxygen may be obtained by diluting the oxygen with an inert gas such as argon, nitrogen, or helium.

A larger value of $a/D_2$ than that obtainable in steam may be obtained by increasing the pressure of steam above the atmospheric pressure or by mixing high-pressure steam with some hydrogen gas.

It can be seen from the foregoing, and especially from FIG. 2, that different combinations of conditions, such as oxidizing temperatures, moisture content, and oxygen concentration, can be used in the practice of the present invention in the production of an n-type layer on a p-type silicon semiconductive body.

FIG. 2 exhibits the temperature dependence of the ratio $a/D_2$ of a boron-doped silicon for oxidation in steam and for oxidation in dry oxygen. The two gases are chosen for illustrative purposes only. Any oxidizing gas, some of them described heretofore, may be used. In fact, for any mixture of gases at a given pressure, the oxidation rate constant at various temperatures can be easily measured as described before. Since the diffusion coefficients of practically all impurities are known, a curve, similar to those shown in FIG. 2, releating the temperature dependence of the ratio $a/D_2$ for any given impurity, can be plotted. Thus any oxidizing gas other than dry oxygen or steam may be used for oxidation without departing from the scope of this invention.

According to the method of the present invention, a given surface concentration of a redistributed solute may be provided by various combinations of the stated parameters, oxidation temperature, moisture content, and oxygen concentration, provided that the operating conditions are such as to maintain the ratio $a/D_{2a}$ at the same value. When oxidation is conducted at lower temperatures, and thus brings about a lower diffusion rate, the junction depth is maintained constant by increasing the oxidation time.

SELECTIVE JUNCTION FORMATION

The foregoing disclosure has been restricted to the application of the instant method for providing an n-type layer on a p-type silicon body by thermal oxidation, the surface of which silicon body is free of any layer or deposit prior to said oxidation. There will now be described the application and theory of the method to the provision of an n-type layer at selected areas only of a p-type silicon semiconductive material. In this embodiment, as exemplified in FIG. 6, in which a cross-sectional view is disclosed, a silicon double doped semiconductive material is provided with an area II, on which a layer of silicon oxide has been produced, and an area I, which is free of oxide or other material layered thereon. Briefly, thermal oxidation of a silicon body of the type shown in FIG. 6 by the method of the invention provides, on the silicon body on area I, two superposed layers—an n-type layer on the silicon body and a silicon oxide layer on the said n-type layer.

FIG. 7 diagrammatically shows a silicon oxide layer over zone II, the silicon oxide layer in this zone, for example, having been formed on the p-type silicon body prior to thermal oxidation, and a silicon oxide layer and an n-type layer produced in area I by the thermal oxidation process of the invention.

In a sense, the oxide or other material layers on area II serve as a mask, just as an oxide layer serves as a mask against diffusion.

The oxidation of silicon is due to the diffusion of some oxygen-bearing species through the oxide layer to the oxide-silicon interface and the rapid conversion of silicon into silicon dioxide. If the diffusion of the oxygen-bearing species in area II is prevented or is slowed down, the oxidation of the silicon in area II is also prevented or slowed down. There will be no redistribution, or only a slight redistribution. The function of the oxide in area II is primarily for preventing or slowing down the oxidation. Any covering material other than silicon dioxide can be used for this purpose if it prevents or slows down the diffusion of oxidizing species from reaching the surface.

Refractory materials such as platinum or tantalum can be sputtered selectively through a metal mask onto the semiconductive material. These metals may serve as the covering material preventing or slowing down the oxidation of the semiconductive material.

Silicon material suitable for use in making selectively planar p-n junction usually consists of silicon semiconductive material containing both acceptor and donor impurities in such concentrations that the acceptor concentration is higher than the donor concentration. Referring to FIG. 6, when it is desired to make a selectively planar p-n junction in a given area, as over area I in FIG. 6, the silicon crystal material is previously covered with an oxide layer over both areas I and II, and selected areas are then etched through a suitable mask to provide an oxide-free surface such as that found in area I. The oxide layer may be put on the crystal by pyrolysis of some silicon compound, or by thermal oxidation. Thermal oxidation under suitable conditions of such silicon body may be so controlled as to provide an oxide passivated n-type layer on the surface of the p-type silicon body, wherein the layer covers only an area shown as area I. FIG. 7 represents one result obtained by the thermal oxidation of a silicon body wherein area I was cleared of oxide or other layer material prior to oxidation. In FIG. 7, the passivated n-type layer is formed only in the area previously free of oxide as selected in desired configuration as represented by area I in both FIGS. 6 and 7.

The structure shown in FIG. 6, wherein zone or area II is covered with an oxide layer and zone or area I is not covered with any layer or coatng of any type, shows, in general, the type of structure to which the present method is applied when it is desired to provide a silicon oxide passivated n-type layer only on the surface of the silicon crystal in zone I, and wherein the surface concentration of donor atoms at the silicon interface is lower than that which is obtainable by conventional diffusion processes.

Some theoretical considerations concerning the formation of an n-type layer on a p-type silicon crystal by thermal oxidation in selected zones or areas are set forth in the following paragraphs.

In the structure of FIG. 6, an area or zone I is bare of surface covering, and an area II is covered with a silicon oxide layer of thickness $X_0$. When the silicon sample, having a structure including an oxide-free and an oxide-covered area, as shown in FIG. 6, is oxidized in an oxidizing atmosphere wherein the oxidation rate-constant is $a$, the oxide, in both zones I and II, grows according to the equation $$dX/dt=2a/X \quad (10)$$

Obviously, at any time during the oxidation, the thicknesses of the oxide in areas I and II are not equal. In area I, the oxide thickness $X_1$ is given as previously explained by the following equation:

$$X_1^2=4at \quad (11)$$

and the rate of growth of the oxide is $$dX_1/dt=(a/t)^{1/2} \quad (12)$$

In area II, the oxide thickness may be given by $$X_2^2=4a(t+t_0) \quad (13)$$

wherein $t_0$ is a constant representing the time that would be necessary to grow an oxide of thickness $X_0$ under the present condition that is given by $$t_0=X_0^2/4a \quad (14)$$

In this area, then, the rate of oxide growth is, according to Equations 10 and 13, $$dX_2/dt=a^{1/2}/(t+t_0)^{1/2} \quad (15)$$

The redistributed surface concentration in area I is time-independent and is a constant, as heretofore explained, and covered by Equations 2 or 3; however, the surface concentration of solute in area II is not time-independent.

Although the problem is rather complex, and although no precise mathematical solution of the problem has yet been obtained for the redistribution of solutes in an area such as that depicted as area II in FIG. 6, a working approach has been made by defining an effective oxidation rate-constant $a_{eff}$ by the equation $$dX_2/dt=(a_{eff}/t)^{1/2} \quad (16)$$

Then, by comparing Equations 15 and 16, it is evident that $$a_{eff}(t)=at/(t+t_0) \quad (17)$$

The effective oxidation rate-constant $a_{eff}$ is a function of time $t$ and is always less than $a$, the oxidation rate-constant existing in area I. The rate-constant is zero at $t=0$ and increases monotonically to $a$ as $t$ increases.

Redistribution factor $R_d$ of a given donor is an increasing function of $a/D_{2d}$ and is equal to unity when $a/D_{2d}=0$, so that $R_d(a_{eff}/D_{2d})=1$ at $t=0$ and approaches $R_d(a/D_{2d})$ asymptotically with time. This indicates that the surface concentration $C_d(X_2, t)$ of the redistributed donor is also a function of time and is equal to the bulk concentration $C_{d0}$ at $t=0$ and increases asymptotically to $C_dR_d(a/D_{2d})$ as oxidation continues. When oxidation has proceeded until $t=t_1$, $a_{eff}$ has increased in value to $a_1$, and its relation to $a$ is given by equation $$a_1=at_1/(t_1+t_0) \quad (18)$$

From this relation, then, it can be seen that the surface concentration of the redistributed donor will be less than or at most equal to that which it would have been if the effective oxidation rate-constant $a_{eff}$ had been equal to $a_1$ during the entire oxidation cycle. If the effective oxidation rate constant $a$ had been equal to $a_1$ during the entire oxidation cycle, the surface concentration of the redistributed donor would have been equal to $$R_d(a_1/D_{2d})C_{d0}$$

Therefore, the actual surface concentration of the redistributed donor $C_d(X_2, t_1)$ must satisfy the following inequality:

$$C_d(X_2, t_1)/C_{d0}\leqq R_d(a_1/D_{2d}) \quad (19)$$

The redistribution factor $R_a$ is determined in a similar manner and is found to be equal to unity when $a/D_{2a}=0$ and, as is characteristic of all acceptors, is a decreasing function of $a/D_{2a}$. The surface concentration of the acceptor is equal to bulk concentration $C_{a0}$ at $t=0$, and the surface concentration decreases to $C_aR_a(a/D_{2a})$ asymptotically as oxidation proceeds. After the oxidation has proceeded until $t=t_1$, the following relation will be true:

$$C_a(X_2, t_1)/C_{a0} \geqq R_a(a_1/D_{2a}) \qquad (20)$$

The foregoing having been developed as the basis for the following inequalities, it can be shown that, when a double doped p-type silicon is oxidized for a time $t_1$ in such an atmosphere that $$R_d(a_1/D_{2d})/R_a(a_1/D_{2a})<C_{a0}/C_{d0} \qquad (21)$$

then $$C_d(X_2t_1)/C_a(X_2, t_1)<1$$

and that no p-n junction is formed on the surface of zone or area II.

An n-type layer is formed over the p-type material in area I when $$R_d(a/D_{2d})/R_a(a/D_{2a})>C_{a0}/C_{d0} \qquad (22)$$

Inequalities 21 and 22 describe necessary conditions if an n layer is to be formed only on the surface of area I and not on the surface of area II by thermal oxidation described herein.

However, the method is capable of being utilized for producing an n-type layer on the surface of p-material in area II in addition to the simultaneous provision of an n-type layer on the surface of area I. Now, although this condition is not generally desirable, a p-type layer forms on the surface of silicon in area II under certain extreme operating conditions, principally when the oxidation time is extended over a long period of time.

Equation 23 is obtained by combining Inequalities 21 and 22.

$$\frac{R_d(a_1/D_{2d})}{R_a(a_1/D_{2a})}<\frac{C_{a0}}{C_{d0}}<\frac{R_d(a/D_{2d})}{R_a(a/D_{2a})} \qquad (23)$$

Relation 23 sets forth conditions under which selective junction formation by thermal oxidation can be provided.

Equation 23, in effect, states that an n-layer will be provided on the surface of area I, as in FIG. 6, for example, so long as the ratio of the redistribution factors $R_d(a/D_{2a})/R_a(a/D_{2d})$ is greater than ratio $C_{a0}/C_{d0}$ and that no n-type layer will form on the surface of area II on continued oxidation so long as the left-hand quantity of $R_d/R_a$ as shown in Relation 23 does not assume a value greater than the ratio $C_{a0}/C_{d0}$.

Although the effective oxidation rate constant $a_1$ is a function of the oxidation time $t_1$, it can, for purposes of better understanding, be expressed in terms of the oxide thickness $X_0$ and $X_1$ according to the following equation:

$$a_1=X_1^2/(X_1^2+X_0^2) \qquad (24)$$

In this equation, $X_0$ is the oxide thickness covering zone or area II before thermal oxidation, as shown in FIG. 6, $X_1$ is the oxide thickness of the layer covering zone or area I after thermal oxidation, as shown in FIG. 7, and $X_2$ is the thickness of oxide covering zone or area II after thermal oxidation, also shown in FIG. 7. The denominator in Equation 24 is equal to $X_2^2$; that is, $$X_2^2=X_1^2+X_0^2$$

The value of $a_1$ may be made as small as desired, theoretically, by covering the silicon crystal sample selectively in area II, as in FIG. 6, with an oxide layer of very large thickness $X_0$ and thermally oxidizing the sample for a short time to form a thin oxide layer, of a thickness $X_1$ in area I, as shown in FIG. 7.

One method of forming an oxide layer over zone or area II consists of depositing such oxide by pyrolysis of an organic silicon compound such as tetraethoxyl silane and then oxidizing the crystal sample at some thermal oxidizing temperature in order to grow the oxide in zone or area I to a desired thickness. For example, an oxide layer having a thickness of three microns is deposited by such chemical means over zone II and the silicon crystal then is thermally oxidized in steam at 1,000 degrees centigrade and so forms an oxide of thickness $X_1$ of 0.1 micron in area I, as shown in FIG. 7. When the thermal oxidation is completed, the effective oxidation rate constant $a_1$ is equal to about $a/900$, and in a situation where the impurity pair consists of phosphorus-boron and where the thermal oxidation is conducted in steam at 1,000 degrees centigrade (from FIG. 2), one then has $a/D_{2a}$ of about 10, and thus the ratio $a_1/D_{2a}$ is seen to be about 0.01.

From the lower curve in FIG. 3, it is apparent that the left-hand redistribution ratio of Equation 23 is equal to about two, and, on the other hand, that the right-hand redistribution ratio is equal to about 60. These two figures, in effect, establish the limiting values of the ratio of boron to phosphorus, $C_{a0}/C_{d0}$, within which thermal oxidation of a sample containing such concentrations of the stated impurities at the above-stated conditions provides an n-type layer in the area or zone I, but not in the area or zone II.

From a practical standpoint, the choice of oxide thickness and of oxidation conditions is rather limited. Because of the limitations of available oxide etching techniques, oxide thickness $X_0$ is, from a practical standpoint, limited to about one micron in order to maintain good definition and good dimensional control of the oxide window. The thickness $X_1$ of the oxide in area I, in which area, in a field effect transistor, an n-type channel will be formed, is principally limited by the device requirement. For example, in an insulated gate field effect transistor, although the thickness of the metal gate oxide layer is usually only about 0.15 micron, this layer of oxide found between the n-type channel and the metal gate of such transistors must be such as to withstand the high electric field created by the potential difference between the drain and the gate without electrical breakdown. Also, since the gate oxide should be dense in order to minimize the effect of ion migration under the influence of high electrical field between the drain and the gate, it is generally preferred to conduct the thermal oxidation, which provides the gate oxide, in a dry oxygen atmosphere. In practice, this means that a low value of ratio $a/D_{2a}$ will be concerned with, which, in turn, leads to narrowing the range allowed by or under Equation 23.

As is evident from a comparison of the arsenic-boron curve and the phosphorus-boron curve of FIG. 3, the ratio $R_d/R_a$ has a larger slope for samples double doped with arsenic-boron than with those containing the phosphorus-boron impurity pair. With respect to the fabrication of n-channel insulated gate field effect transistors, the center value of the allowed range of concentration for the arsenic-boron pair $C_{a0}/C_{d0}$ is approximately 4. When a junction is formed with these impurities present in the mentioned concentration range, the junction is shallow and has about the same thickness as the oxide formed during the thermal oxidation.

One modification of the method of the invention consists of doping the oxide layer over area II. This treatment greatly enhances the selectivity aspect of the invention, in that the doping substantially decreases the amount of acceptor depletion into the oxide from the silica in the area II. To achieve this result, the oxide mask is doped with an acceptor at a concentration which is slightly more than $k$ (segregation coefficient of the acceptor) times the bulk concentration of the acceptor in the silicon. During the thermal oxidation of a silicon crystal having a doped oxide layer, such as the oxide over area II, the donor atoms will tend to be accumulated slightly; however, the total number of acceptor atoms will not be depleted under the mask. The acceptor atoms doped in the oxide will diffuse into the silicon, thus compensating the depletion of acceptors doped in the silicon.

A boron-doped oxide layer over zone II can be easily prepared by pyrolysis of tetraethoxyl silane containing a small amount of trimethyl borate. The double doped silicon in area II, adjacent to the oxide layer, may also contain boron; however, the acceptor may be gallium or indium without affecting or decreasing the effect of doping the oxide layer in this area.

In the foregoing descriptions, the oxide layer on the silicon crystals was prepared or deposited, as in area II, by a separate and conventional method such as the chemical deposition method previously described. The oxide layer may be formed over the whole surface of the silicon crystal in a distinct and separate step, and, as stated previously, the oxide layer may be deposited by conventional methods, principally chemical deposition method, to form either a doped or an undoped oxide layer. This oxide layer mask may then be etched by conventional means so as to remove the oxide in those areas in which it is desired to expose the surface of the silicon crystal, such as area I, shown in FIGS. 6 and 7.

In contrast to the type of oxide layer mask described above, the following description will be restricted to an oxide layer, such as an oxide formed over area or zone II in FIGS. 6 and 7, prepared by thermally growing the oxide over the silicon crystal by oxidizing the crystal of silicon under such conditions that $R_d/R_a<C_{a0}/C_{d0}$ is satisfied, so that, in this modification, an oxide layer is grown or deposited over a silicon crystal by thermally growing the oxide in a manner analogous to the formation of the thermally-grown oxide layers previously described but without forming an n-type layer under the oxide. After the oxide mask is grown, it is necessary only to etch certain portions of the oxide mask in order to make the exposed areas available for further oxidation under selected conditions.

Selective junction formation in double doped silicon crystal having a thermally-grown silicon oxide layer is successful only because the oxide layer can be grown without the formation of an n-type inversion layer during the formation of the oxide.

Briefly, selective junction formation in a double doped silicon crystal, wherein a thermally-grown oxide layer is formed on said crystal, comprises (1) growing, by thermal oxidation, an oxide layer over a double doped silicon crystal under such condition that no n-type inversion layer is formed during the oxidation, (2) exposing a desired area, such as zone or area I in FIG. 6, by etching the overlying oxide covering said area, and (3) re-oxidizing the silicon crystal having oxide-coated area or zone II and exposed area or zone I under such conditions that an n-type inversion layer and an oxide layer are formed in zone I and no n-type layer is formed in the area or zone II.

The first oxidation is carried on under such a condition that $R_d/R_a<C_{a0}/C_{d0}$ is satisfied, and an oxide layer is thermally grown without forming an n-type layer under the oxide just grown. During this oxidation, both the donor and the acceptor impurities are redistributed, giving a donor surface concentration of $R_dC_{d0}$ and an acceptor surface concentration of $R_aC_{a0}$. The oxide in area I is etched off, leaving the area II still covered with an oxide. During the second oxidation for selective junction formation, the impurities are redistributed again. This second redistribution is a very complicated process. The exact nature is not known.

However, the surface concentrations of the two impurities in both area I and area II at the very beginning of the second oxidation for selective junction formation are known. These surface concentrations are not constant but change slowly during the course of this second oxidation. As the oxidation proceeds, these surface concentrations will approach limits common to both area I and area II. The donor impurity in both areas will approach a common limit, and the acceptor impurity in both areas will approach a common limit also. These two limits are dependent on the temperature and the composition of the oxidizing gas used for the second oxidation. These known surface concentrations, the beginning concentrations and the limiting concentrations of both the donor and the acceptor in each of the areas I and II, are sufficient to serve as guides for the junction-forming oxidation.

The second oxidation may be carried out under the same condition as the mask-making oxidation, or under another oxidation condition with redistribution factors $R_d'$ and $R_a'$ for the donor and the acceptor, respectively If the second oxidation is carried out under the same oxidation conditions as the mask-making oxidation, then the oxide in area II will continue to grow according to square root law as if the oxidation operation had not been interrupted, and the surface concentrations of the impurities will remain constant, being $R_aC_{a0}$ for the acceptor and $R_dC_{d0}$ for the donor. There will be no junction formation in area II. In area I under these same oxidation conditions, the surface concentrations of the acceptor and the donor have been changed to $R_aC_{a0}$ and $R_dC_{d0}$. At the very beginning of the second oxidation, these concentrations will change to $R_a^2C_{a0}$ and $R_d^2C_{d0}$, respectively. A p-n junction will be formed in area I if the donor concentration is larger than the acceptor concentration; that is, if $$C_{a0}/C_{d0}<R_d^2/R_a^2 \quad (26)$$

Hence, the condition for selective junction formation is $$R_d/R_a<C_{a0}/C_{d0}<R_d^2/R_a^2 \quad (27)$$

The surface concentrations of the acceptor and the donor in area I are not constant.' They are expected to change slowly from $R_a^2C_{a0}$ to $R_aC_{a0}$ and from $R_d^2C_{d0}$ to $R_dC_{d0}$, respectively, and eventually the n-type layer in area I will disappear. Therefore, the condition for selective junction formation given by (27) is valid only if the second oxidation does not take too long.

If the junction-forming oxidation is carried out under different oxidation conditions from the first oxidation, with redistribution factors $R_d'$ and $R_a'$, then the solutes in both area I and area II will be redistributed again. In area I, at the very beginning of the second oxidation, the surface concentration of the donor will go up from $R_dC_{d0}$ to $R_d'R_dC_{d0}$, and that of the acceptor will go down from $R_aC_{a0}$ to $R_a'R_aC_{a0}$. An n-type inversion layer will appear if $$C_{a0}/C_{d0}<R_d'R_d/R_a'R_a \quad (28)$$

Hence, the condition for selective junction formation in this case is $$R_d/R_a<C_{a0}/C_{d0}<R_dR_d'/R_aR_a' \quad (29)$$

As oxidation proceeds, the surface concentration of the solutes in both area I and area II will change slowly to $R_d'C_{d0}$ and $R_a'C_{a0}$, respectively. If $R_d'/R_a'>C_{a0}C_{d0}$, an n-type layer will also appear in area II, forming a p-n junction everywhere. On the other hand, if $R_d'/R_a'<C_{a0}/C_{d0}$, the n-type layer just formed in area II will disappear, leaving no junction anywhere.

I claim:

1. A method of selectively forming an n-type zone protected by a silicon oxide covering, under only a selected area of the surface of a p-type silicon doubly-doped crystal, comprising:

(a) masking the surface of a p-type silicon crystal doubly doped by boron and a donor selected from the group consisting of phosphorus and arsenic, with a silicon oxide layer mask having a sufficient thickness to substantially stop the passage of oxygen therethrough upon heating said crystal, wherein the silicon oxide layer mask is doped with an acceptor in a concentration at least equal to acceptor concentration in silicon adjacent said silicon oxide layer mask;

(b) removing a portion of said silicon oxide layer mask over a selected area of said p-type doubly-doped silicon crystal; and (c) heating said p-type doubly-doped silicon crystal in an oxidizing atmosphere for a time and at a temperature between 950 degrees centigrade and 1,250 degrees centigrade to form an n-type zone, protected by a silicon oxide covering, under only said selected area.

2. A method of selectively forming an n-type zone, protected by a silicon oxide covering, under only a selected area of the surface of a p-type silicon doubly-doped crystal, comprising:

(a) masking the surface of a p-type silicon crystal doubly doped by boron and a donor selected from the group consisting of phosphorus and arsenic, with a silicon oxide layer mask having a sufficient thickness to substantially stop the passage of oxygen therethrough upon heating said crystal;

(b) removing a portion of said silicon oxide layer mask over a selected area of said p-type doubly doped silicon crystal; and (c) heating said p-type doubly doped silicon crystal in an oxidizing atmosphere for a time and at a temperature between 950 degrees centigrade and 1,250 degrees centigrade, to form an n-type zone, protected by a silicon oxide covering, under only said selected area.

3. The method of claim 2 wherein the silicon oxide layer mask is chemically deposited.

References Cited

UNITED STATES PATENTS

| | | | |
|---|---|---|---|
| 2,462,218 | 2/1949 | Olsen | 148—191 |
| 2,899,344 | 8/1959 | Atalla | 148—191 XR |
| 3,155,551 | 11/1964 | Bennett | 148—191 |
| 3,085,033 | 4/1963 | Handelman | 148—191 |
| 3,162,557 | 12/1964 | Brock | 141—191 |
| 3,183,128 | 5/1965 | Leistiko | 148—191 XR |
| 2,203,840 | 8/1965 | Harris | 148—191 |
| 2,953,486 | 9/1960 | Atalla | 148—191 |

HYLAND BIZOT, *Primary Examiner.*

148—191